(12) United States Patent
Shin et al.

(10) Patent No.: US 10,861,998 B2
(45) Date of Patent: Dec. 8, 2020

(54) COMPOUND SEMICONDUCTOR SOLAR CELL AND METHOD OF MANUFACTURING THE SAME

(71) Applicant: LG ELECTRONICS INC., Seoul (KR)

(72) Inventors: Junoh Shin, Seoul (KR); Kitae An, Seoul (KR); Huijae Lee, Seoul (KR); Hyeunseok Cheun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 175 days.

(21) Appl. No.: 16/007,449

(22) Filed: Jun. 13, 2018

(65) Prior Publication Data

US 2018/0366608 A1 Dec. 20, 2018

(30) Foreign Application Priority Data

Jun. 14, 2017 (KR) .................. 10-2017-0075004

(51) Int. Cl.
 *H01L 31/18* (2006.01)
 *H01L 31/0216* (2014.01)
 (Continued)

(52) U.S. Cl.
 CPC ...... *H01L 31/186* (2013.01); *H01L 31/02168* (2013.01); *H01L 31/022466* (2013.01);
 (Continued)

(58) Field of Classification Search
 CPC ............ H01L 31/186; H01L 31/02168; H01L 31/022466; H01L 31/03046;
 (Continued)

(56) References Cited

U.S. PATENT DOCUMENTS

| | | | | |
|---|---|---|---|---|
| 4,677,740 A | * | 7/1987 | Shifrin | H01L 21/00 438/24 |
| 5,863,412 A | * | 1/1999 | Ichinose | C25F 3/12 205/652 |

(Continued)

FOREIGN PATENT DOCUMENTS

| | | |
|---|---|---|
| JP | 2016-225627 A | 12/2016 |
| KR | 10-2011-0068219 A | 6/2011 |

(Continued)

*Primary Examiner* — Scott B Geyer
(74) *Attorney, Agent, or Firm* — Birch, Stewart, Kolasch & Birch, LLP (57) ABSTRACT

Disclosed is a method of manufacturing a compound semiconductor solar cell including forming a compound semiconductor layer; and forming a defect-removed portion formed of an empty space through removing a portion of the compound semiconductor layer where a defect existed prior to removal. The forming of the defect-removed portion includes forming a mask material layer on the compound semiconductor layer; forming a mask layer through forming an opening at a portion of the mask material layer corresponding to the portion of the compound semiconductor layer where the defect exists; and etching the compound semiconductor layer for removing the portion of the compound semiconductor layer where the defect exists through the opening of the mask layer to form the defect-removed portion.

12 Claims, 7 Drawing Sheets

(51) Int. Cl.
*H01L 31/0224* (2006.01)
*H01L 31/0735* (2012.01)
*H01L 31/0304* (2006.01)

(52) U.S. Cl.
CPC .... *H01L 31/03046* (2013.01); *H01L 31/0735* (2013.01); *H01L 31/1844* (2013.01); *H01L 31/1876* (2013.01); *H01L 31/1884* (2013.01)

(58) Field of Classification Search
CPC ............. H01L 31/0735; H01L 31/1844; H01L 31/1876; H01L 31/1884; H01L 22/20; H02S 50/00; H02S 50/10; H02S 50/15
See application file for complete search history.

(56) References Cited

U.S. PATENT DOCUMENTS

| | | | |
|---|---|---|---|
| 2014/0196782 A1* | 7/2014 | Lin | H01L 22/12 136/256 |
| 2015/0063388 A1* | 3/2015 | Sun | H01L 31/0725 372/44.01 |
| 2015/0068594 A1* | 3/2015 | Nishiyama | H01L 31/03685 136/256 |
| 2016/0093763 A1* | 3/2016 | Rana | H01L 31/035281 438/57 |
| 2017/0117432 A1* | 4/2017 | Bailly | H01L 31/1804 |
| 2018/0159060 A1* | 6/2018 | Verilhac | H01L 51/5012 |
| 2018/0204777 A1* | 7/2018 | Bae | H01L 22/20 |

FOREIGN PATENT DOCUMENTS

| | | |
|---|---|---|
| KR | 10-2012-0137949 A | 12/2012 |
| KR | 10-2013-0136739 A | 12/2013 |
| KR | 10-1542209 B1 | 8/2015 |

* cited by examiner

COMPOUND SEMICONDUCTOR SOLAR CELL AND METHOD OF MANUFACTURING THE SAME

CROSS-REFERENCE TO RELATED APPLICATION

This application claims priority to and the benefit of Korean Patent Application No. 10-2017-0075004, filed in the Korean Intellectual Property Office on Jun. 14, 2017, the entire contents of which are incorporated herein by reference in its entirety.

BACKGROUND OF THE INVENTION

Field of the Invention

Embodiments of the invention relate to a compound semiconductor solar cell and a method of manufacturing the same, and more particularly, to a compound semiconductor solar cell an improved structure and a method of manufacturing the same having an improved process.

Description of the Related Art

Recently, as existing energy resources such as petroleum and coal are expected to be depleted, interest in alternative energy to replace them is increasing. Among them, solar cells are attracting attention as a next-generation battery that converts solar energy into electric energy.

In such solar cells, various layers and electrodes may be fabricated by a design. An efficiency of a solar cell may be determined by the design of these various layers and electrodes. In order to commercialize a solar cell, various layers and electrodes are required to be formed so as to improve the productivity and reliability of the solar cell.

For example, in a compound semiconductor solar cell including compound semiconductor layers, an undesirable defect may be formed at the compound semiconductor layer during a process. If a recombination occurs at a portion of the compound semiconductor layer where a defect exists, efficiency of the compound semiconductor solar cell may be deteriorated. In a case of adding a process for removing a defect to prevent this, properties of the compound semiconductor layer may be degraded or unwantly changed, or a material contained in the compound semiconductor layer may be scattered during the process of removing defects, resulting in safety problems. In addition, the process for removing the defects should be performed, and a separate process or a separated stabilizing device for solving the problems that may occur during such a process is required, which may complicate the process or increase the equipment burden.

SUMMARY OF THE INVENTION

Therefore, embodiments of the invention have been made in view of the above problems, and the invention is to provide a compound semiconductor solar cell being able to be manufactured by a simple manufacturing method and being able to improve efficiency, and a method of manufacturing the same.

A method of manufacturing a compound semiconductor solar cell according to an embodiment of the invention includes forming a compound semiconductor layer; and forming a defect-removed portion formed of an empty space through removing a portion of the compound semiconductor layer where a defect existed prior to removal. The forming of the defect-removed portion includes forming a mask material layer on the compound semiconductor layer; forming a mask layer through forming an opening at a portion of the mask material layer corresponding to the portion of the compound semiconductor layer where the defect exists; and etching the compound semiconductor layer for removing the portion of the compound semiconductor layer where the defect exists through the opening of the mask layer to form the defect-removed portion.

A compound semiconductor solar cell according to an embodiment of the invention includes a compound semiconductor layer including a base layer and an emitter layer having different conductivity types; a first electrode electrically connected to the base layer; and a second electrode electrically connected to the emitter layer. A defect-removed portion formed of an empty space is provided in the compound semiconductor layer.

According to an embodiment of the invention, by a defect-removed portion in which a defect is entirely removed, problems that may occur due to the defect can be prevented and an efficiency of a compound semiconductor solar cell can be enhanced. In this instance, since the defect-removed portion is formed by forming a mask layer through using a laser exposure and a development, and then, removing a portion of a compound semiconductor layer through an etching process, a stability of a process of forming the defect-removed portion can be improved, a manufacturing process can be simplified, and an equipment cost can be minimized. Particularly, when the defect-removed portion is formed together with a partition portion, the manufacturing process can be further simplified. Accordingly, a compound semiconductor solar cell having an excellent efficiency can be manufactured by a simple manufacturing process.

DETAILED DESCRIPTION OF THE EMBODIMENTS

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, a compound semiconductor solar cell and a method of manufacturing the same according to an embodiment of the invention will be described in detail with reference to the accompanying drawings.

Figure 1:
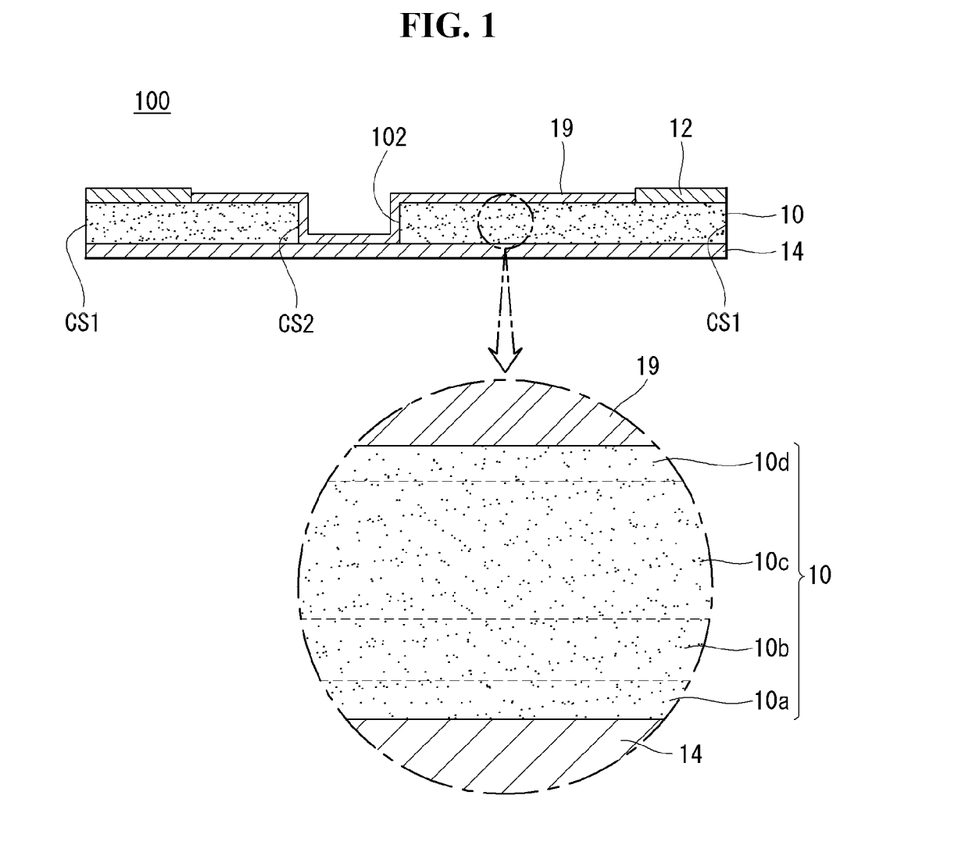
FIG. 1 is a cross-sectional view schematically showing a compound semiconductor solar cell according to an embodiment of the invention.

FIG. 1 is a cross-sectional view schematically showing a compound semiconductor solar cell according to an embodiment of the invention.

Referring to FIG. 1, a compound semiconductor solar cell 100 according to the embodiment includes a plurality of compound semiconductor layers 10, which include a base layer 10c and an emitter layer 10b having different conductivity types to form a pn junction, a first electrode 12 electrically connected to the base layer 10c, and a second electrode 14 electrically connected to the emitter layer 10b. In this instance, a defect-removed portion 102 formed of an empty space is provided in the plurality of compound semiconductor layers 10 in a plan view. The plurality of compound semiconductor layers 10 may further include a back surface field layer 10a, a window layer 10d, or the like, and the compound semiconductor solar cell 100 may further include an anti-reflection layer 19 or the like. This will be described in more detail.

Hereinafter, it is exemplified that the back surface field layer 10a, the emitter layer 10b, the base layer 10c, the window layer 10d, and the first electrode 12 are sequentially formed on the second electrode 14. For example, the second electrode 14, the back surface field layer 10a, the emitter layer 10b, the base layer 10c, the window layer 10d, and the first electrode 12 may be sequentially formed to be in contact with each other.

However, the embodiments of the invention are not limited thereto. Thus, at least one of the back surface field layer 10a and the window layer 10d may be not formed, or a contact layer having a high doping concentration for ohmic contact may be provided between the window layer 10d and the first electrode 12 or between the back surface field layer 10a and the second electrode 14. In this instance, a contact layer positioned between the window layer 10d and the first electrode 12 may have the same shape and pattern as the first electrode 12. A buffer layer having the same conductivity type as that of the base layer 10c and having a doping concentration lower than the base layer 10c may be further provided between the emitter layer 10b and the base layer 10c. When the emitter layer 10b and the base layer 10c are formed of different materials and/or compositions, a material and/or composition of the buffer layer may be varied from a material and/or composition that is the same or similar to that of the emitter layer 10b to a material and/or composition that is the same or similar to that of the base layer 10c as it goes from the emitter layer 10b to the base layer 10c. Various other variations are possible.

In the embodiment, the plurality of compound semiconductor layers 10 may be formed of or may include a compound semiconductor layer of III-V compound including Group III element and group V element, a compound semiconductor layer II-VI compound including group II element and group VI element. Particularly, each of the plurality of compound semiconductor layers 10 may be formed of a compound semiconductor layer of III-V compound.

For example, the compound semiconductor layer 10 (particularly, the base layer 10c) may be a gallium-indium-phosphorus (GaInP) compound semiconductor including gallium (Ga), indium (IN), and phosphorus (P), may be an aluminum-indium-phosphorus (AlInP) compound semiconductor layer including aluminum (Al), indium (In), and phosphorus (P), or may be a gallium-arsenide (GaAs) including gallium (Ga) and arsenic (As). As described above, the compound semiconductor solar cell 100 based on the compound semiconductor layer of III-V compound has a direct transition bandgap, and thus, has a higher light absorption rate than the conventional silicon solar cell, and has excellent properties by covalent bonding. Also, a multi junction structure can be applied, and thus, the compound semiconductor solar cell 100 can have high efficiency and can be manufactured by a simple process.

The base layer 10c is a layer that substantially absorbs light and is directly involved in photoelectric conversion and may include a first conductive type dopant to have a first conductivity type.

The window layer 10d positioned on (e.g., in contact with) the base layer 10c serves as a barrier for preventing a movement of undesired carriers (electrons and holes), and serves as a passivation for preventing a surface recombination. The window layer 10d is doped with a first conductivity type dopant to have the first conductivity type dopant, as the base layer 10d. A doping concentration of the first conductivity type dopant of the window layer 10d may be higher than that of the base layer 10c. The window layer 10d may be formed of a material the same as or different from that of the base layer 10c. Also, energy bandgap of the window layer 10d may be the same as or higher than energy bandgap of the base layer 10c. For example, when the window layer 10d has higher energy bandgap than that of the base layer 10c, the window layer 10d can effectively act as a barrier and a light absorption can be minimized The emitter layer 10b is a layer including a second conductivity type dopant to have a second conductive type opposite to the first conductivity type of the base layer 10c. The emitter layer 10b is positioned on the base layer 10c to form a pn junction with the base layer 10c. The emitter layer 10b may be formed of a material the same as that of the base layer 10c so that the emitter layer 10b and the base layer 10c have the same energy bandgap, except that the emitter layer 10b includes the second conductive type dopant. Also, the emitter layer 10b may be formed of a material different from that of the base layer 10c to have energy bandgap different from energy bandgap of the base layer 10c.

The back surface field layer 10a positioned between the second electrode 14 and the emitter layer 10b (for example, in contact with them) is doped with a second conductive dopant, as the emitter layer 10b. A doping concentration of the second conductivity type dopant of the back surface field layer 10a may be lower than that of the emitter layer 10b. The back surface field layer 10a may be formed of the same material as the emitter layer 10b or the window layer 10d and may be formed of a different material from the emitter layer 10b or the window layer 10d.

The back surface field layer 10a, the emitter layer 10b, the base layer 10c, and the window layer 10d may be formed at an entire portion without having a predetermined pattern so as to sufficiently perform their respective roles.

The base layer 10c and the window layer 10d may be classified into a first conductivity type semiconductor layer including a first conductivity type dopant to have a first conductivity type, and the emitter layer 10b may be classified into a second conductivity type semiconductor layer including a second conductivity type dopant to have a second conductivity type.

For example, the first conductivity type may be n-type, the first conductivity type dopant may be an n-type dopant, the second conductivity type may be p-type, and the second conductivity type dopant may be a p-type dopant. Here, the p-type dopant may include at least one of zinc, carbon, and magnesium, and the n-type dopant may include at least one of silicon, selenium, and tellurium. Thus, when the base layer 10c has an n-type, the base layer 10c has few defects and can have a high quality. However, the embodiments of the invention are not limited thereto. Thus, the first conductivity type may be p-type and the second conductivity type may be n-type.

The first electrode 12 electrically connected to the base layer 10c and the anti-reflection layer 19 may be formed on a surface (for example, the front surface) of the compound semiconductor layer 10, and the second electrode 14 electrically connected to the emitter layer 10b may be formed on the other surface (for example, a back surface) of the compound semiconductor layer 10.

The first electrode 12 and the second electrode 14 may collect the carriers generated by the photoelectric conversion. The first and second electrodes 12 and 14 may comprise a conductive material (e.g., a metal) or a semiconductor material to collect carriers. The first and second electrodes 12 and 14 may be formed of a single layer or have a plurality layers comprising gold, silver, nickel, titanium, platinum, copper, palladium, molybdenum, germanium, or an alloy comprising at least one of them.

As described above, the first electrode 12 may be positioned on (e.g., in contact with) the front surface of the compound semiconductor layer 10 on which light is incident. Accordingly, at least a part of the first electrode 12 (particularly, an opaque layer of the first electrode 12) may have a certain pattern so that light can be incident on the compound semiconductor layer 10 serving as a photoelectric conversion unit. For example, at least a part of the first electrode 12 may include a plurality of electrode portions extended in a direction to parallel to each other and a bus bar electrode connecting the plurality of electrode portions in a direction crossing the plurality of electrode portions. Alternatively, the first electrode 12 may further include a transparent conductive material (TCO) where light can transmit and that is formed entirely on the front surface, together with an opaque layer having a pattern.

The second electrode 14 may be positioned on (e.g., in contact with) the back surface of the compound semiconductor layer 10. The second electrode 14 may be a sheet-like conductive layer entirely formed without a certain pattern. The second electrode 14 may be a sheet electrode.

Figure 5:
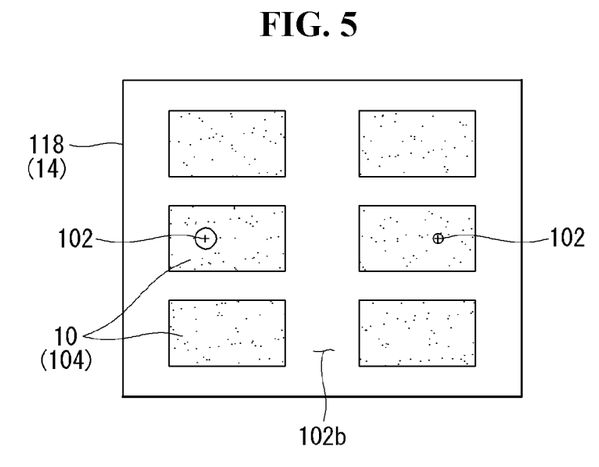
FIG. 5 is a plan view showing the compound semiconductor layer formed by a process shown in FIG. 2L.

In the embodiment, the defect-removed portion 102 formed of an empty space may be provided in the compound semiconductor layer 10. The defect-removed portion 102 may be formed by entirely removing a defect which is located inside the compound semiconductor layer 10. The defect-removed portion 102 is formed of an empty space in which the compound semiconductor layer 10 does not exist in the active area AA where the compound semiconductor layer 10 should be positioned as a whole. The defect-removed portion 102 may be formed or a kind of a trench, a recess, or the like. The defect-removed portion 102 may have an island shape having a closed space in a plan view, as shown in FIG. 5. As described above, in the embodiment, since the defect-removed portion 102 is formed by entirely removing the defect existing in the compound semiconductor layer 10, problems that may occur due to the defect (for example, a recombination, a leakage current, or the like that may occur at the defect) can be prevented and an efficiency of the compound semiconductor solar cell 100 can be enhanced.

In the embodiment, the defect-removed portion 102 may be formed at a portion where the first electrode 12 having a pattern is not positioned and the defect-removed portion 102 may be seen from an outside. This is because the defect-removed portion 102 is formed after the first electrode 12 is formed. Alternatively, the first electrode 12 may not be formed at a portion where a defect 102a (refer to FIG. 2A) is located in consideration with the first electrode 12 and the second electrode 14 may be short-circuited by the defect 102a. Since the defect-removed portion 102 is formed at a portion where the first electrode 12 does not exist, an undesirable short-circuit between the first electrode 12 and the second electrode 14 by the defect-removed portion 102 can be prevented. However, the embodiments of the invention are not limited thereto. Therefore, the defect-removed portion 102 may be formed at a portion where the first electrode 12 is positioned, and the defect-removed portion 102 may have a material, a structure, or the like capable of preventing a short circuit between the first electrode 12 and the second electrode 14.

Since the second electrode 14 is formed entirely on the compound semiconductor layer 10, the defect-removed portion 102 may penetrate through the compound semiconductor layer 10 to expose the second electrode 14. Since the defect-removed portion 102 penetrates through the compound semiconductor layer 10, problems that may be induced by the defect 102a can be effectively prevented. In this instance, since the defect-removed portion 102 does not penetrate through the second electrode 14, a structural stability of the compound semiconductor solar cell 100 can be improved.

In this instance, an etched surface CS2 constituting a side surface of the defect-removed portion 102 is a wet etched surface formed by a wet etching, and thus, the etched surface CS2 may not have a trace by a laser. Whether the etched surface CS2 of the defect-removed portion 102 is formed by the wet etching or not may be determined by reading the etching surface CS2 of the defect-removed portion 102 using a scanning electron microscope (SEM). For example, the etched surface CS2 of the defect-removed portion 102, which is formed of the wet etched surface, may have an under-cut shape by the wet etching. Alternatively, a trace by the wet etching may be left on the second electrode 14 at the portion where the defect-removed portion 102 is formed. The trace by the laser is a trace of melting or bursting by a laser, and the trace may be distinguished by using a scanning electron microscope and the like.

In the embodiment, an etching surface CS1 constituting an outer side surface of the compound semiconductor layer 10 and the etching surface CS2 constituting the side surface of the defect-removed portion 102 are etch surfaces having the same properties. In particular, the etched surface CS1 constituting the outer side surface of the compound semiconductor layer 10 and the etched surface CS2 of the defect-removed portion 102 may be composed of wet etched surfaces formed by a wet etching. That is, the etched surface CS2 of the defect-removed portion 102 and the etched surface CS1 of the compound semiconductor layer 10 may be formed together in the same process and thus have the same properties.

Here, a reason why the defect is formed, a method of forming the defect-removed portion 102, a planar shape and a cross-sectional shape of the defect-removed portion 102, the etching surface CS1 constituting the outer side surface of the compound semiconductor layer 10, and the etched surface CS2 constituting the side surface of the defect-removed portion 102 will be described later in more detail with reference to FIGS. 2A to 2M and FIGS. 3 to 7.

The anti-reflection layer 19 is positioned on (e.g., in contact with) the front surface of the compound semiconductor layer 10 at a portion where the first electrode 12 is not positioned. The anti-reflection layer 19 can reduce a reflection of light. However, the embodiments of the invention are not limited thereto, and the anti-reflection layer 19 may be disposed on at least a part of the first electrode 12 (for example, on the plurality of electrode portions described above) as well as on the compound semiconductor layer 10. The anti-reflection layer 19 may be formed of a single layer or have a multi-layered structure including at least one of magnesium fluoride, zinc sulfide, titanium oxide, and silicon oxide.

In the embodiment, the anti-reflection layer 19 is formed not only on the compound semiconductor layer 10, but also on the side surfaces of the second electrode 14 exposed by the defect-removed portion 102 and/or the side surfaces of the defect-removed portion 102. For example, the anti-reflection layer 19 may be in contact not only with the compound semiconductor layer 10, but also with the side surfaces of the second electrode 14 exposed by the defect-removed portion 102 and/or the side surfaces of the defect-removed portion 102. As the surface of the defect-removed portion 102 (particularly the etched surface CS2) and the second electrode 14 are entirely covered by the anti-reflection layer 19, the portion where the defect-removed portion 102 is formed is stably protected. However, the embodiments of the invention are not limited thereto, and various modifications are possible. For example, the anti-reflection layer 19 may be not formed at a portion where the defect-removed portion 102 is formed.

When light is incident on the compound semiconductor solar cell 100, electrons and holes are generated by photoelectric conversion of the compound semiconductor layer 10, and one of the electron or the hole is collected at the first electrode 12 and the other one of the electron or the hole is collected at the second electrode 14, and thereby generating electrical energy. In the embodiment, the compound semiconductor layer 10 is provided with the defect-removed portion 102 in which a defect is entirely removed, thereby preventing problems that may occur when the defect exists and improving an efficiency of the compound semiconductor solar cell 100.

A method of manufacturing a compound semiconductor solar cell 100 having a defect-removed portion 102 will be described with reference to FIGS. 2A to 2M.

FIGS. 2A to 2M are cross-sectional views showing a method of manufacturing a compound semiconductor solar cell according to an embodiment of the invention.

Figure 2A:
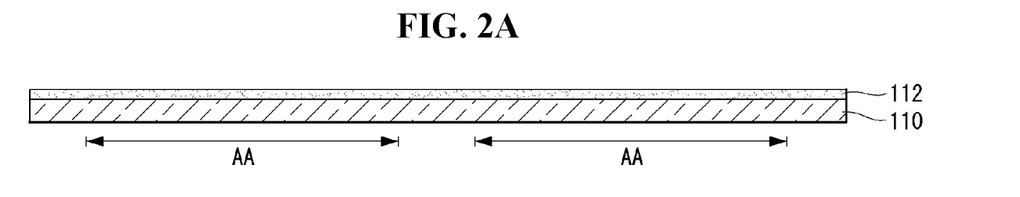
FIGS. 2A to 2M are cross-sectional views showing a method of manufacturing a compound semiconductor solar cell according to an embodiment of the invention.

As shown in FIG. 2A, a substrate 110 having a release layer (or a sacrificial layer) 112 formed on a surface thereof is prepared. The substrate 110 may be formed of a compound including a Group IV element, III-V compound including group III element and group V element, or II-VI compound including group II element and group VI element. For example, the substrate 110 may include a silicon (Si) substrate, a germanium (Ge) substrate, a gallium-arsenic compound (GaAs) substrate, or the like. In particular, in the embodiment, the substrate 110 may be a GaAs substrate.

The release layer 112 is a layer for separating the substrate 110 and a compound semiconductor layer 10 (see FIG. 2B) by an etching performed after a growth of the compound semiconductor layer is completed. The release layer 112 may be formed by any of various processes and may include any of various materials that may be released or peeled by an epitaxial lift-off (ELO) process. For example, the release layer 112 may be formed of an AlGaAs layer/an InAlAs layer, an InGaAs layer, an AlAs layer, an InGaP layer, an InAlP layer, an InGaAlAs layer, an InP layer, or the like.

Figure 2B:
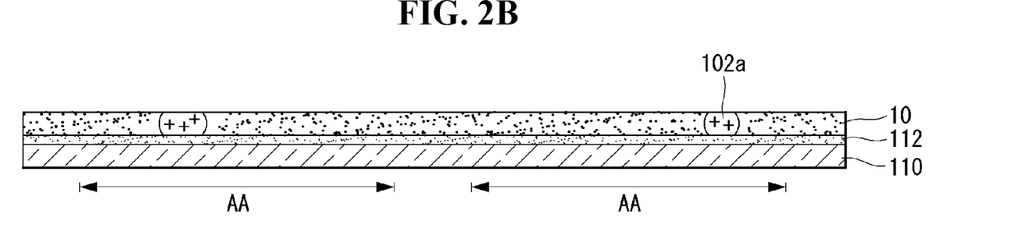

Next, as shown in FIG. 2B, a compound semiconductor layer 10 is formed on the release layer 112. In this instance, the compound semiconductor layer 10 may be entirely formed without having a pattern.

More specifically, as described above, in the embodiment, the compound semiconductor layer 10 may include a back surface field layer 10a (see FIG. 1), an emitter layer 10b (see FIG. 1), a base layer 10c (see FIG. 1), and a window layer 10d (see FIG. 1). In this instance, the back surface field layer 10a, the emitter layer 10b, the base layer 10c, and the window layer 10d may be sequentially formed on the release layer 112 when the compound semiconductor layer 10 is formed. Then, the compound semiconductor layer 10 can be stably formed. In this instance, as described above, some layers may not be formed or another layer may be formed.

The compound semiconductor layer 10 may be formed by any of various methods such as a metal organic chemical vapor deposition (MOCVD) process, a molecular beam epitaxy (MBC) process, or the like. As an example, a metal organic chemical vapor deposition process may be used. That is, the substrate 110 is placed in a metal organic chemical vapor deposition apparatus heated to a predetermined deposition temperature, and a plurality of gases (for example, reaction gases, each including element constituting the compound semiconductor layer 10, a gas including an n-type or p-type dopant, or the like) are supplied into a chamber, thereby forming a compound semiconductor layer 10 formed of desired materials. In this instance, the compound semiconductor layer 10 including a plurality of layers can be formed by a simple process by changing kinds, amounts, and the like of the reaction gases supplied in the deposition process.

In the embodiment, the compound semiconductor layers 10 may be formed entirely to correspond to and to cover a plurality of active areas AA spaced from each other. A plurality of active areas AA are divided by a partition portion 102b (see FIG. 2L) later, and each portion corresponding to each active area AA partitioned by the partition portion 102b constitutes a unit solar cell (that is, a compound semiconductor solar cell 100). This will be described in more detail later.

Figure 3:
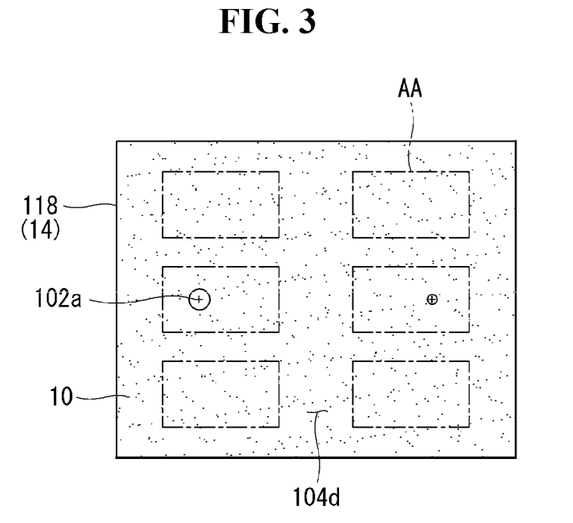
FIG. 3 is a plan view showing a compound semiconductor layer formed by a process shown in FIG. 2B.

Meanwhile, as shown in FIG. 2B and FIG. 3, when the compound semiconductor layer 10 is formed, a defect 102, which cannot contribute to a photoelectric conversion or adversely affects the photoelectric conversion, may be formed. For your reference, FIG. 3 is a plan view showing the compound semiconductor layer 10 formed by the process shown in FIG. 2B. In FIG. 3, an illustration of the first electrode 12 is omitted for simplicity and clarity. In this case, the defect 102a may be formed for any of various reasons. Particularly, the defect 102a may be formed by an impurity that is unwantly mixed into the compound semiconductor layer 10 during the deposition process, or the defect 102 may be formed of a damaged portion or an undesirable hole formed at a part of the compound semiconductor layer 10 generated by the impurity. If the defect 102a exists, the photoelectric conversion does not occur and a recombination generates at the corresponding portion. Thus, an efficiency of the compound semiconductor solar cell 100 may be lowered. Also, the first electrode 12 and the second electrode 14 may be short-circuited to generate a leakage current.

Figure 2C:
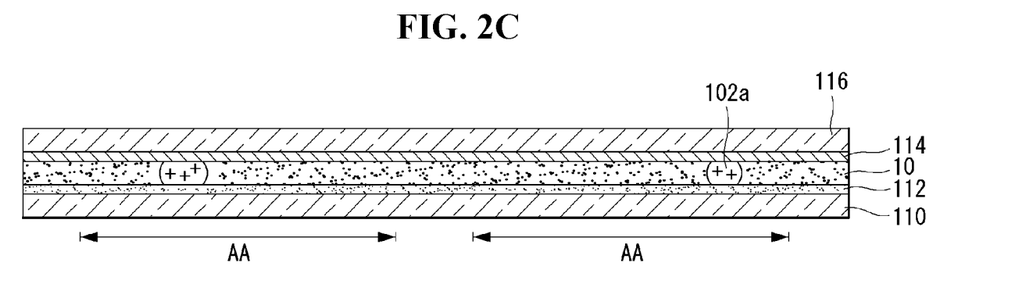
Figure 2D:
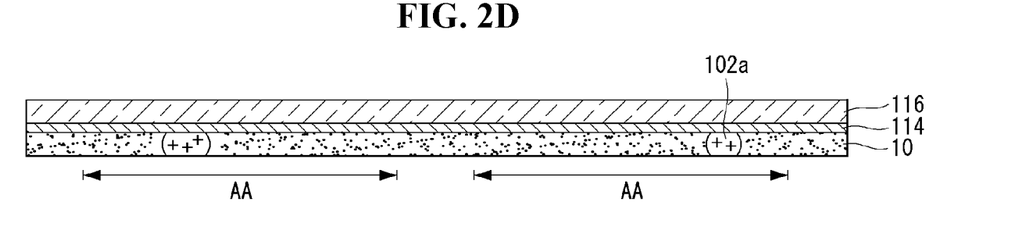

Next, as shown in FIG. 2C, a protective metal layer 114 is formed on the compound semiconductor layer 10, and a first lamination film 116 is attached on the protective metal layer 114. The protective metal layer 114 may be formed of any of various materials having corrosion resistance to an etching solution used in an epitaxial lift-off process, which is shown in FIG. 2D. The first lamination film 116 may be formed of any of various materials that can support the compound semiconductor layer 10. In one example, the protective metal layer 114 may be formed of copper. The first lamination film 116 may include a support substrate and an adhesive layer disposed thereon. As the support substrate, polyethylene terephthalate (PET) may be used. As the adhesive layer, ethylene vinyl acetate (EVA) may be used. However, the embodiments of the invention are not limited to the material of the protective metal layer 114 and the first lamination film 116.

Next, as shown in FIG. 2D, the release layer 112 is etched by an epitaxial lift-off process so that the substrate 110 is separated from the compound semiconductor layer 10, the protective metal layer 114, and the first lamination film 116. Any of various known etching solutions may be used for the etching of the release layer 112. For example, a hydrofluoric acid solution may be used.

Figure 2E:
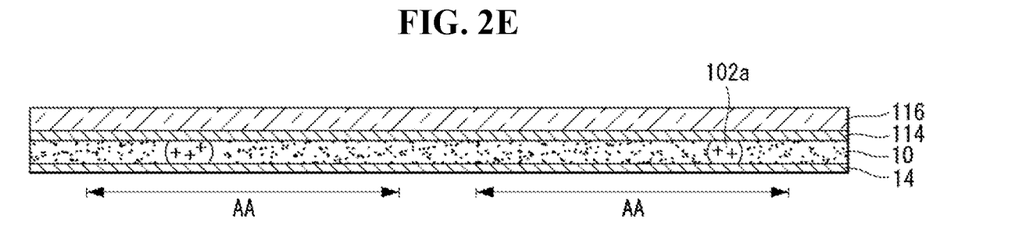

Next, as shown in FIG. 2E, a second electrode 14 is formed on a back surface of the compound semiconductor layer 10 exposed after the substrate 110 is removed. Any of various known methods may be used for forming the second electrode 14. In this instance, the second electrode 14 may be formed to correspond to all of the plurality of active areas AA.

Figure 2F:
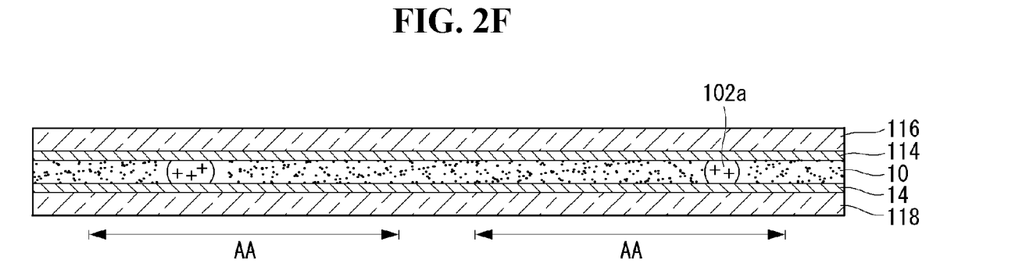

Next, as shown in FIG. 2F, a second lamination film 118 is attached on the second electrode 14. The second lamination film 118 may be formed of any of various materials that can support the compound semiconductor layer 10. The second lamination film 118 may include a support substrate and an adhesive layer disposed thereon. As the support substrate, polyethylene terephthalate (PET) may be used. As the adhesive layer, ethylene vinyl acetate (EVA) may be used.

Figure 2G:
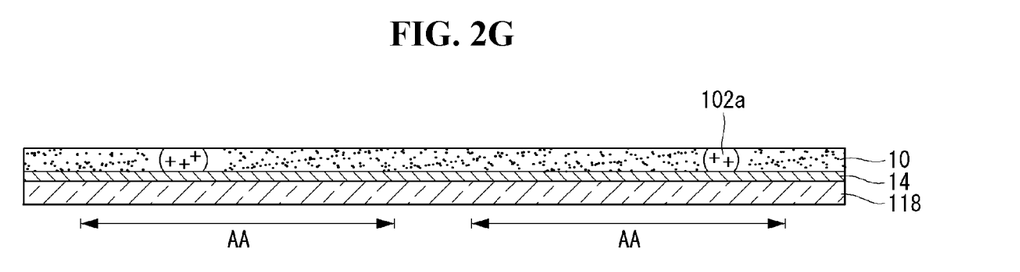

Next, as shown in FIG. 2G, the first lamination film 116 and the protective metal layer 114 are removed. Any of various known methods may be used for removing the first lamination film 116 and the protective metal layer 114.

Figure 2H:
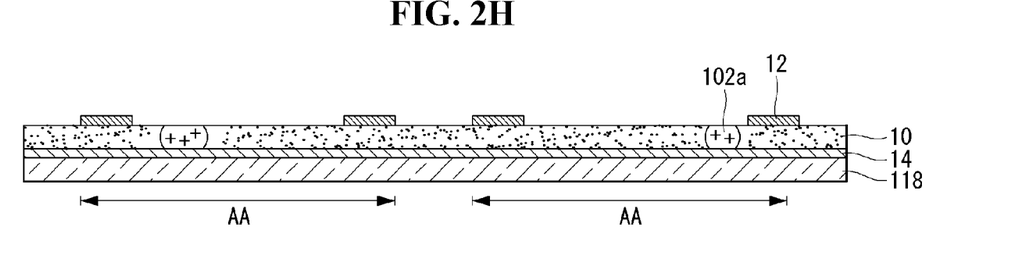

Next, as shown in FIG. 2H, the first electrode 12 is formed on a front surface of the compound semiconductor layer 10 exposed by a removal of the first lamination film 116 and the protective metal layer 114. In this instance, the first electrode 12 may be formed in each of the plurality of active areas AA.

The first electrode 12 may be formed by any of various methods. For example, the first electrode 12 may be formed with a pattern using a printing process. However, the embodiments of the invention are not limited thereto. Thus, the first electrode 12 may be formed by entirely forming an electrode layer and then partially etching the electrode layer. When a contact layer is positioned between the window layer 10d and the first electrode 12, the contact layer may be etched and patterned using the first electrode 12 as a mask after forming the first electrode 12 having a predetermined pattern.

In the above descriptions and the related drawings, it is exemplified that the back surface field layer 10a, the emitter layer 10b, the base layer 10c, and the window layer 10d are sequentially formed on the release layer 112. However, the embodiments of the invention are not limited thereto. Therefore, the window layer 10d, the base layer 10c, the emitter layer 10b, and the back surface field layer 10a may be sequentially formed on the release layer 112. In this instance, the second electrode 14 is formed on the back surface field layer 10a, the release layer 112 is removed to separate the substrate 110, and then, the first electrode 12 is formed on the window layer 10d. Various other modifications are possible.

As described above, since the defect 102a may exist in the compound semiconductor layer 10, as shown in FIG. 2I to FIG. 2L, a portion where the defect 102a exists in the compound semiconductor layer 10 is removed to form a defect-removed portion 102 of an empty space. In the embodiment, a process of forming a partition portion 102b in the compound semiconductor layer 10 (so called mesa-etching process) such that the compound semiconductor layer 10 is divided into a plurality of unit solar cells after the process of forming the compound semiconductor layer 10. In this instance, the defect-removed portion 102 may be formed together in the mesa-etching process forming the partition portion 102b. That is, in the embodiment, the process of forming the defect-removed portion 102 and the process of forming the partition portion 102b may be performed by the same etching process, and thus, the defect-removed portion 102 and the partition portion 102b may be formed together. This will be described in more detail.

Figure 2I:
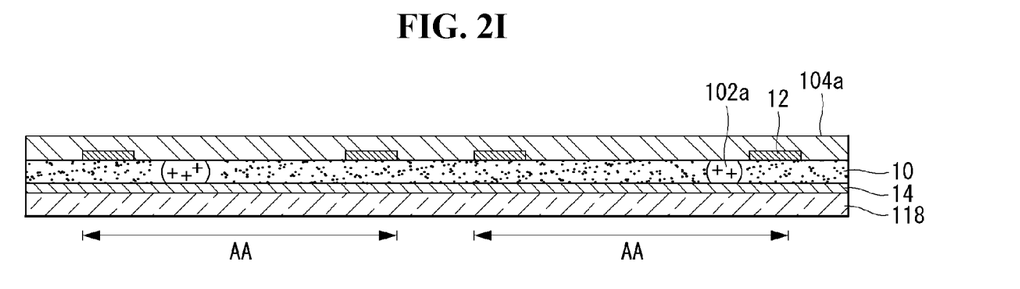
Figure 2J:
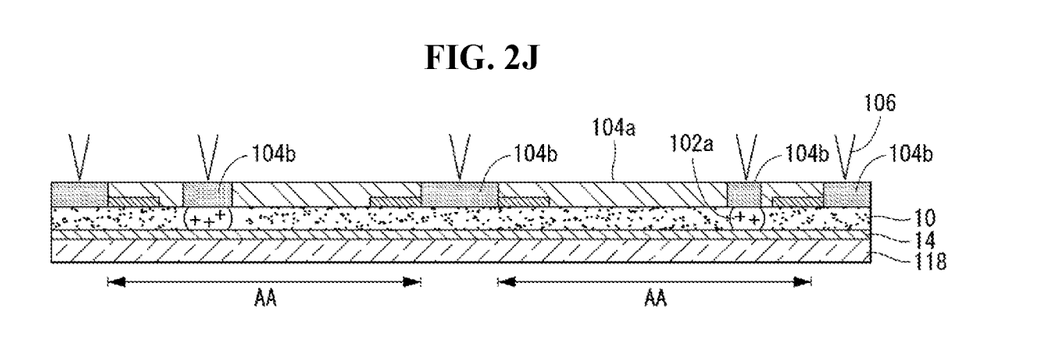
Figure 2K:
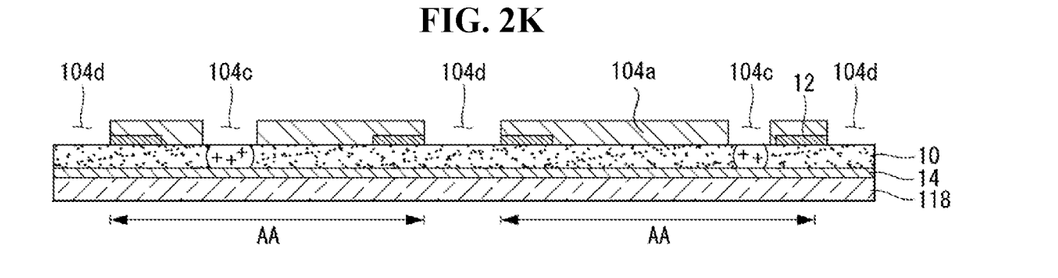
Figure 2L:
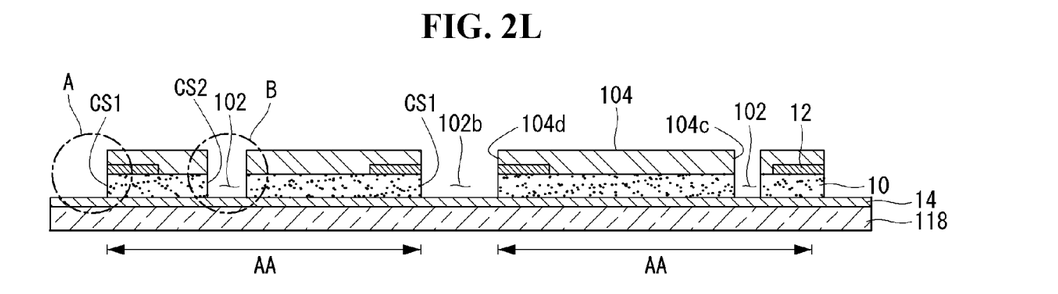

First, as shown in FIG. 2I, a mask material layer 104a is entirely formed on the compound semiconductor layer 10. Next, as shown in FIGS. 2J to 2K, a mask layer 104 is formed by forming an opening 104c at the mask material layer 104a to correspondence to a portion where the defect 102a exists in the compound semiconductor layer 10 so as to expose the defect 102a. In this instance, a partition opening 104d for the partition portion 102b may be formed together while forming the opening 104c. Then, as shown in FIG. 2L, a defect-removed portion 102 is formed by removing a portion of the compound semiconductor layer 10 exposed by the opening 104c (that is, a portion where the defect 102a exists). In this instance, a portion of the compound semiconductor layer 10 exposed by the partition opening 104d may be removed together to form the partition portion 102b together.

The mask material layer 104a may be formed of any of various materials where the opening 104c and/or the partition opening 104d can be formed by any of various methods. Hereinafter, an example, it will be exemplified that the mask material layer 104a is formed of a photosensitive material and an exposure process using a laser is used to form the opening 104c. When the exposure process using the laser is used, the opening 104c can be selectively formed by a simple process at the portion where the defect 102a exists. This will be described in more detail.

The mask material layer 104a is partially exposed using the laser 106 as shown in FIG. 2J, and a part of the mask material layer 104a is removed by a development process as shown in FIG. 2K, thereby forming the opening 104c. In this instance, since the portion where the defect 102a exists in the compound semiconductor layer 10 is different from the other portions (for example, the portion where the defect 102a exists in the compound semiconductor layer 10 is shiny), it can be discriminated by a naked eye, a microscope, a camera, or the like. In this manner, the opening 104c is formed to correspondence to the portion where it is determined that the defect 102a exists by the naked eye, the microscope, the camera, or the like.

In this instance, the partition opening 104d may be formed after an exposure process using the laser 106. That is, in the exposure process using the laser 106, an exposure for the opening 104c and an exposure the opening for the partition portion 104d may be performed together to reduce a facility burden. In the embodiment, the partition opening 104d may be formed so as to correspond to an entire area other than the active areas AA.

In the drawings, it is exemplified that the mask material layer 104a is formed of a positive photosensitive material. That is, a portion to be removed (that is, a portion corresponding to the opening 104c and/or a portion corresponding to the partition opening 104d) is exposed by the laser 106 to form an exposed portion 104b, and the exposed portion 104b is removed by a development process, thereby forming the opening 104c and/or the partition opening 104d. This minimizes an area of the exposed portion 104b and thus simplifies a manufacturing process. However, the embodiments of the invention are not limited thereto. Thus, the mask material layer 104a may be formed of a negative photosensitive material. That is, a portion to be remained (that is, a portion where the opening 104c and/or the partition opening 104d will be not formed) is exposed by the laser 106 to form an exposed portion, and a portion except for the exposed portion is removed by a development process, thereby forming the opening 104c and/or the partition opening 104d.

In the embodiment described above, the laser 106 is used to expose portions corresponding to the opening 104c and the partition opening 104d together. However, the embodiments of the invention are not limited thereto. Therefore, an exposure process (hereinafter, a first exposure process) for forming the opening 104c and an exposure process (hereinafter, a second exposure process) for forming the partition opening 104d may be performed separately. The defect 102a is irregularly present in the compound semiconductor layer 10. Thus, the defect 102a may be discriminated by a naked eye, a microscope, a camera, or the like only after the compound semiconductor layer 10, and then, the opening 104 is formed at the portion of the defect 102a. Therefore, it is effective to use the laser 106, since it is difficult to use a separate mask. On the other hand, since the partition opening 104d is formed in a predetermined portion according to a design, it is more efficient to use a mask manufactured according to the design. In consideration of this, the opening 104c may be formed by using the first exposure process using the laser 106 without an additional mask, while the partition opening 104d may be formed by the second exposure using the laser 106 or using a different light source with a mask. For example, a portion corresponding to the partition opening 104d or a portion other than the partition opening 104d may be exposed using an ultraviolet (UV) lamp using a mask. The second exposure process can be simplified by using the mask and the ultraviolet lamp in the second exposure process, and the opening 104c corresponding to the defect 102a can be easily formed by using the first exposure process through using the laser 106. In this instance, the first exposure process may be performed first, and then, the second exposure process may be performed. Alternatively, the second exposure process may be performed first, and then, the first exposure process may be performed. However, also in this case, the exposed portion or the unexposed portion by the first exposure process and the second exposure process are developed together in the developing process, thereby simplifying the process.

Any of various known processes may be performed for the development process.

As an example, the opening 104c may have an area equal to or greater than an area of the defect 102a. In this case, even when there is a process error in the manufacturing process, the defect 102a can be entirely removed. However, the embodiments of the invention are not limited thereto. Thus, since the defect-removed portion 102 may be formed larger than the opening 104c in the etching process, the opening 104c may have an area smaller than an area of the defect 102a.

Figure 4:
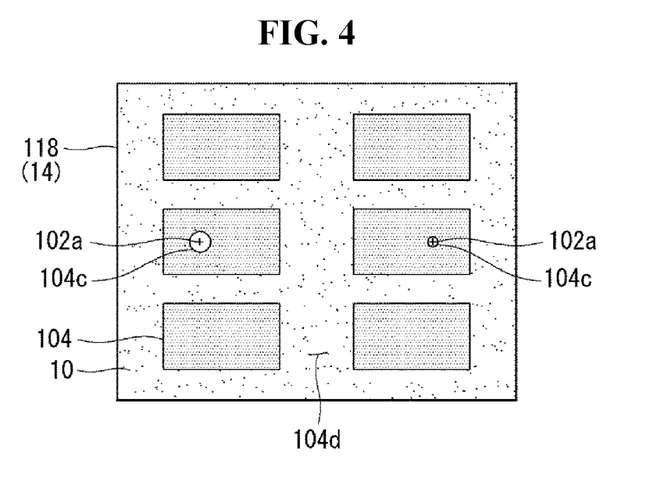
FIG. 4 is a plan view showing a mask layer formed on the compound semiconductor layer formed by a process shown in FIG. 2K.

Thus, as shown in FIG. 2K and FIG. 4, a mask layer 104 formed on the compound semiconductor layer 10 has the opening 104c and the partition opening 104d. For reference, FIG. 4 is a plan view showing the mask layer 104 formed on the compound semiconductor layer 10 formed by the process shown in FIG. 2K. For simplicity and clarity, an illustration of the first electrode 12 is omitted in FIG. 4.

Next, as shown in FIG. 2L, a portion of the compound semiconductor layer 10 exposed by the opening 104c is removed by an etching process to form a defect-removed portion 102. In this instance, a portion of the compound semiconductor layer 10 exposed by the partition opening 104d may be removed together in the same etching step to form the partition portion 102b together. The etching process may be performed by a wet etching process. Then, a desired portion of the compound semiconductor layer 10 can be easily etched by a simple process.

In the embodiment, the opening 104c is formed to expose the defect 102a of the compound semiconductor layer 10 as a whole, and then, the defect 102a is entirely removed in the etching process. Thus, the defects 102a are not left at the compound semiconductor layer 10. Since the defect-removed portion 102 is formed after forming the first electrode 12 having the pattern in the embodiment, the defect-removed portion 102 may be formed by removing the defect 102a at a portion where the first electrode 12 having the pattern is not formed. In this way, the defect-removed portion 102 is formed at the portion where the first electrode 12 is not formed, and thus, a short circuit of the first electrode 12 and the second electrode 14 at an undesirable portion can be prevented by the defect-removed portion 102. In the etching process, the second electrode 14 may remain without being removed.

As described above, the opening 104c and/or the partition opening 104d of the mask layer 104 is formed by using the laser 106 and the compound semiconductor layer 10 is etched by the wet etching process. Thus, the laser beam cannot be directly irradiated to the compound semiconductor layer 10. Thus, a stability of the process of forming the defect-removed portion 102 and/or the partition portion 102b can be improved. In addition, the defect 102a can be entirely removed so that the defect 102a does not remain, and problems caused by the defect 102a can be prevented.

On the other hand, if the compound semiconductor layer 10 is directly irradiated with the laser to remove a portion of the compound semiconductor layer 10, a problem related to a stability due to scattering of a material (particularly, arsenic (As)) included in the compound semiconductor layer 10 can be prevented. It is necessary to use a separate and expensive equipment in order to prevent such a problem, which may result in a burden on an equipment cost.

In this instance, in the mesa-etching process for forming the partition portion 102b, the defect-removed portion 102 may be formed together. Accordingly, the defect-removed portion 102 can be formed by a simple process without adding any additional process.

Thus, as shown in FIG. 2L and FIG. 5, the compound semiconductor layer 10 is divided into a plurality of regions corresponding to the plurality of active areas AA by the partition portion 102b, and the portion where the defect 102a was present in the compound semiconductor layer 10 can be entirely removed to form the defect-removed portion 102. The defect-removed portion 102 may have an island shape formed of a closed space in a plan view to correspond to the portion where the defect 102a was present. For reference, FIG. 5 is a plan view showing the compound semiconductor layer 10 formed by the process shown in FIG. 2L. In FIG. 5, an illustration of the first electrode 12 is omitted for simplicity and clarity.

Figure 6:
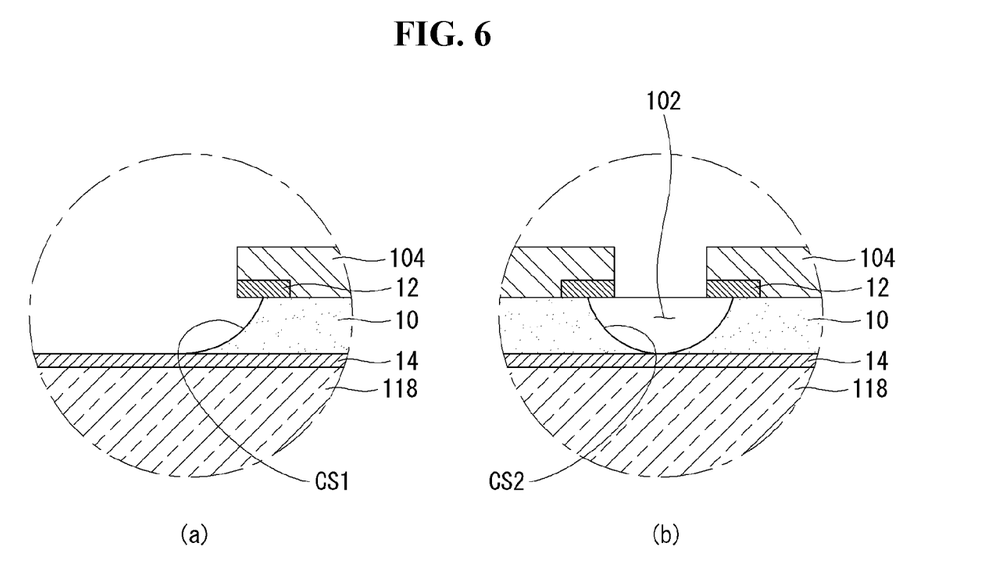
FIG. 6 is enlarged cross-sectional views showing an example of etched surfaces of a defect-removed portion and a partition portion formed by an etching process of a method of manufacturing a compound semiconductor solar cell according to an embodiment of the invention.
Figure 7:
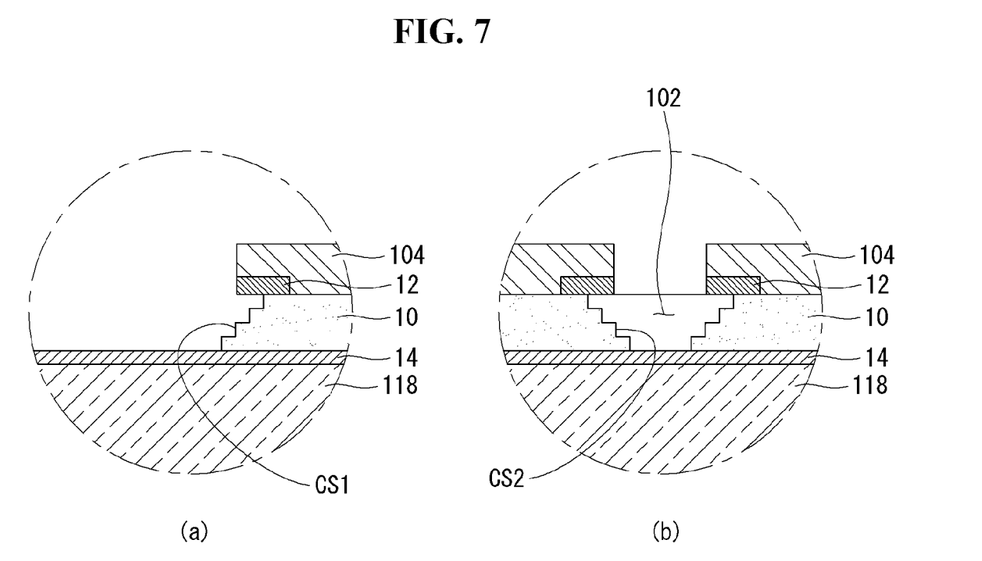
FIG. 7 is enlarged cross-sectional views showing another example of etched surfaces of a defect-removed portion and a partition portion formed by an etching process of a method of manufacturing a compound semiconductor solar cell according to an embodiment of the invention.

When the defect-removed portion 102 and the partition portion 102b are formed by the same etching process as described above, an etched surface CS2 constituting a side surface of the defect-removed portion 102 and an etched surface CS1 constituting a side surface of the partition portion 102b may be etching surfaces (i.e., wet-etching surfaces) having the same properties. With reference to FIGS. 6 and 7, the etch surfaces CS1 and CS2 of the defect-removed portion 102 and the partition portion 102b may have under-cuts by a wet etching. Shapes of the etched surfaces CS1 and CS2 of the defect-removed portion 102 and the partition portion 102b will be described in more detail with reference to FIGS. 6 and 7.

FIG. 6 is enlarged cross-sectional views showing an example of etched surfaces CS1 and CS2 of a defect-removed portion 102 and a partition portion 102b formed by an etching process of a method of manufacturing a compound semiconductor solar cell 100 according to an embodiment of the invention. FIG. 7 is enlarged cross-sectional views showing another example of etched surfaces CS1 and CS2 of a defect-removed portion 102 and a partition portion 102b formed by an etching process of a method of manufacturing a compound semiconductor solar cell 100 according to an embodiment of the invention.

The under-cut formed by the wet etching may have various shapes formed by an isotropic etching so that more etching is performed in a portion opposite to the portion adjacent to the second electrode 14.

For example, as shown in (a) and (b) of FIG. 6, under-cuts formed at the etched surfaces CS1 and CS2 may have a rounded shape. Alternatively, as shown in (a) and (b) of FIG. 7, under-cuts formed at the etched surfaces CS1 and CS2 may have a stepped shape. In this instance, when the etched surface CS2 of the defect-removed portion 102 has a rounded under-cut, the etched surface CS1 of the partition portion 102b also has a rounded under-cut. When the etched surface CS1 of the defect-removed portion 102 has a stepped under-cut, the etched surface CS2 of the partition portion 102b also has a stepped under-cut. This is because the defect-removed portion 102 and the partition portion 102b are formed by the same wet etching process, and the shape and the like of the under-cut may be varied depending on etching conditions even in the wet etching process. In addition, the under-cut formed at the etched surfaces CS1 and CS2 may have any of various shapes such as a shape having an inclined surface.

Figure 2M:
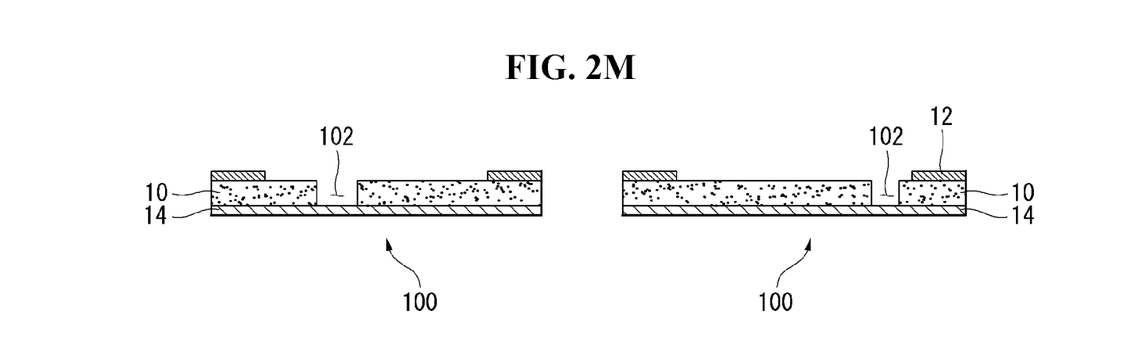

Next, as shown in FIG. 2M, a portion of the second electrode 14 that does not correspond to the active areas AA is removed, and the mask layer 104 and the second lamination film 118 are removed. Thus, the first electrode 12, the compound semiconductor layer 10, and the second electrode 14 are separated so as to correspond to a plurality of unit solar cells (i.e., a plurality of compound semiconductor solar cells 100).

As an example, the portion of the second electrode 14 that does not correspond to the active areas AA may be removed by a scribing process. Any of various known processes may be used as the scribing process. Also, any of various known processes may be used for removing the mask layer 104 and the second lamination film 118.

Then, the compound semiconductor solar cell 100 shown in FIG. 1 may be manufactured by forming an anti-reflection layer 19. Any of various known methods may be applied for forming the anti-reflection layer 19. For example, the anti-reflection layer 19 may be formed by a deposition or the like.

According to such a method of manufacturing a compound semiconductor solar cell 100, the defect-removed portion 102 in which the defect 102a is entirely removed is formed after the compound semiconductor layer 10 is formed, and thus, problems that may occur due to the defect 102a can be prevented and an efficiency of a compound semiconductor solar cell 100 can be enhanced. In this instance, since the defect-removed portion 102 is formed by forming the mask layer 104 through using the exposing prose using the laser exposure and the development process, and then, removing a portion of the compound semiconductor layer through the etching process, a stability of the process of forming the defect-removed portion 102 can be improved, a manufacturing process can be simplified, and an equipment cost can be minimized. Particularly, when the defect-removed portion 102 is formed together with the partition portion 102b, the manufacturing process can be further simplified. Accordingly, the compound semiconductor solar cell 100 having an excellent efficiency can be manufactured by a simple manufacturing process.

In the drawings and the above descriptions, after the compound semiconductor layer 10 corresponding to the plurality of active areas AA is formed, the partition portion 102b is formed and the scribing process is performed to divide plurality of compound semiconductors. However, the embodiments of the invention are not limited thereto, and the substrate 10 corresponding to one active area AA may be used as it is without dividing the compound semiconductor layer 10. In this case, the process of forming the partition portion 102b (i.e., the mesa-etching process) and the scribing process may not be performed.

Also, in the drawings and the above descriptions, it is exemplified the compound semiconductor solar cell 100 has a single-junction structure. In the single-junction structure, a plurality of compound semiconductor layers 10 constituting one photoelectric conversion portion is provided. However, the embodiments of the invention are not limited thereto. The compound semiconductor solar cell 100 may further include another photoelectric conversion unit having another base layer together with the plurality of compound semiconductor layers 10 constituting the one photoelectric conversion unit described above. That is, the compound semiconductor solar cell 100 may have a multi junction structure including a plurality of photoelectric conversion units. When a plurality of photoelectric conversion units are provided, a tunnel junction layer for electrically connecting the two adjacent photoelectric conversion units may be located between the two adjacent photoelectric conversion units. In this instance, the defect-removed portion 102 may be formed corresponding to one photoelectric conversion unit, or may be formed in at least two of the plurality of photoelectric conversion units.

The features, structures, effects and the like according to the above-described embodiments are included in at least one embodiment of the invention, and are not necessarily limited to only one embodiment. Further, the features, structures, effects and the like illustrated in the embodiments can be combined and modified by the persons skilled in the art to which the embodiments are pertained. Therefore, it is to be understood that the invention is not limited to these embodiments.

What is claimed is:

1. A method of manufacturing a compound semiconductor solar cell, the method comprising:
   forming a compound semiconductor layer; and
   forming a defect-removed portion formed of an empty space through removing a portion of the compound semiconductor layer where a defect existed prior to removal,
   wherein the forming of the defect-removed portion comprises:
     forming a mask material layer on the compound semiconductor layer;
     forming a mask layer through forming an opening at a portion of the mask material layer corresponding to the portion of the compound semiconductor layer where the defect exists; and
     etching the compound semiconductor layer for removing the portion of the compound semiconductor layer where the defect exists through the opening of the mask layer to form the defect-removed portion, and
   wherein the etching of the compound semiconductor layer is performed by a wet etching.

2. The method according to claim 1, wherein the mask material layer comprises a photosensitive material, and
   wherein, in the forming of the mask layer, the opening is formed by partially exposing the mask material layer using a laser exposure and developing the mask material layer.

3. The method according to claim 1, wherein the defect is entirely removed in the etching of the compound semiconductor layer.

4. The method according to claim 1, further comprising:
   forming a partition portion at the compound semiconductor layer such that the compound semiconductor layer is partitioned to form a plurality of unit solar cells, after the forming of the compound semiconductor layer,
   wherein the etching of the compound semiconductor layer and the forming of the partition portion are performed by the same etching process.

5. The method according to claim 4, wherein the mask material layer comprises a photosensitive material, and
   wherein, in the forming of the mask layer, the opening and a partition opening corresponding to the partition portion are formed together by partially exposing the mask material layer using a laser exposure and developing the mask material layer.

6. The method according to claim 4, wherein the mask material layer comprises a photosensitive material, and
   wherein the forming of the mask layer comprises:
     first exposure of the mask material layer for the opening using a laser exposure;
     second exposure of the mask material layer for a partition opening for the partition portion; and
     developing for removing exposed portions or non-exposed portions formed by the first exposure and the second exposure,
   wherein the first exposure and the second exposure are performed separately.

7. The method according of claim 6, wherein the second exposure is performed using a mask and an ultraviolet lamp.

8. The method according to claim 6, wherein the second exposure is performed after the first exposure, or the first exposure is performed after the second exposure.

9. The method according to claim 4, wherein an etched surface constituting a side surface of the defect-removed portion and an etched surface constituting a side surface of the partition portion are formed to have the same property.

10. The method according to claim 4, wherein each of an etched surface constituting a side surface of the defect-removed portion and an etched surface constituting a side surface of the partition portion has an under-cut by the wet etching.

11. The method according to claim 1, further comprising:
    forming a first electrode having a pattern on a surface of the compound semiconductor layer on which the mask material layer is formed, between the forming of the compound semiconductor layer and the forming of the defect-removed portion,
    wherein, in the forming of the defect-removed portion, the defect existing at a portion of the compound semiconductor layer where the first electrode is not positioned is removed.

12. The method according to claim 1, further comprising:
    forming a second electrode on a surface of the compound semiconductor layer opposite to a surface of the compound semiconductor layer on which the mask material layer is formed, between the forming of the compound semiconductor layer and the forming of the defect-removed portion,
    wherein the defect-removed portion penetrates through the compound semiconductor layer to expose the second electrode, and
    wherein the method further comprises forming an anti-reflection layer for covering the defect-removed portion of the compound semiconductor layer and a portion of the second electrode exposed through the defect-removed portion, after the forming of the defect-removed portion.

\* \* \* \* \*